US012804339B2

(12) United States Patent
Zeng

(10) Patent No.: US 12,804,339 B2
(45) Date of Patent: Nov. 17, 2026

(54) METHOD OF DETECTING EARPHONE WEARING, EARPHONE, AND STORAGE MEDIUM

(71) Applicant: GOERTEK INC., Weifang (CN)

(72) Inventor: Kai Zeng, Weifang (CN)

(73) Assignee: GOERTEK INC., Weifang (CN)

( * ) Notice: Subject to any disclaimer, the term of this patent is extended or adjusted under 35 U.S.C. 154(b) by 197 days.

(21) Appl. No.: 18/773,750

(22) Filed: Jul. 16, 2024

(65) Prior Publication Data

US 2024/0373180 A1 Nov. 7, 2024

Related U.S. Application Data

(63) Continuation of application No. PCT/CN2022/102123, filed on Jun. 29, 2022.

(30) Foreign Application Priority Data

Mar. 23, 2022 (CN) ........................ 202210288323.X

(51) Int. Cl.
*H04R 29/00* (2006.01)
*G01R 27/26* (2006.01)
(Continued)

(52) U.S. Cl.
CPC ......... *H04R 29/00* (2013.01); *G01R 27/2605* (2013.01); *H04R 1/10* (2013.01); *H04R 5/033* (2013.01)

(58) Field of Classification Search
CPC .......... H04R 29/00; H04R 1/10; H04R 5/033; G01R 27/2605
(Continued)

(56) References Cited

U.S. PATENT DOCUMENTS 10,045,111 B1 * 8/2018 Bonner ................ H04R 1/1041
2019/0098390 A1 * 3/2019 Carino .................. H04R 5/033
(Continued)

FOREIGN PATENT DOCUMENTS

CN 103796145 A 5/2014
CN 106291121 A 1/2017
(Continued)

OTHER PUBLICATIONS

International Search Report and Written Opinion issued in mailed Aug. 19, 2022, 12 pgs.
(Continued)

*Primary Examiner* — Vivian C Chin
*Assistant Examiner* — Con P Tran
(74) *Attorney, Agent, or Firm* — HAUPTMAN HAM, LLP

(57) ABSTRACT

Disclosed are a method of detecting earphone wearing, an earphone and a storage medium, and the present application belongs to the technical field of active noise cancellation (ANC). The earphone includes at least two capacitive sensors. The method of detecting earphone wearing includes the following steps: determining whether the earphone is in the wearing state; in response to that capacitance values of all the capacitive sensors are less than a corresponding initial threshold value, determining that the earphone falls out; and in response to that a capacitance value of at least one capacitive sensor is not less than the corresponding initial threshold value, determining that the earphone becomes loose.

8 Claims, 3 Drawing Sheets

(51) Int. Cl.
*H04R 1/10* (2026.01)
*H04R 5/033* (2006.01)

(58) Field of Classification Search
USPC ....... 381/309, 74, 56, 58; 324/548, 658, 686
See application file for complete search history.

(56) References Cited

U.S. PATENT DOCUMENTS

| | | | | |
|---|---|---|---|---|
| 2019/0215611 | A1 | 7/2019 | Lou et al. | |
| 2020/0100010 | A1* | 3/2020 | Yang | H04R 1/10 |

FOREIGN PATENT DOCUMENTS

| | | | |
|---|---|---|---|
| CN | 109792573 | A | 5/2019 |
| CN | 110603815 | A | 12/2019 |
| CN | 112055296 | A | 12/2020 |
| CN | 112911484 | A | 6/2021 |
| CN | 113038325 | A | 6/2021 |
| CN | 113473292 | A | 10/2021 |
| CN | 114630242 | A | 6/2022 |

OTHER PUBLICATIONS

First Office Action issued in Chinese Patent Application No. 202210288323.X, mailed Jan. 21, 2024, 14 pgs.
Notification to Grant Patent Right for Invention issued in Chinese Patent Application No. 202210288323.X, mailed Feb. 21, 2024, 3 pgs.

* cited by examiner

METHOD OF DETECTING EARPHONE WEARING, EARPHONE, AND STORAGE MEDIUM

CROSS-REFERENCE TO RELATED APPLICATIONS

The present application is a continuation application of International Application No. PCT/CN2022/102123, filed on Jun. 29, 2022, which claims priority to Chinese patent application No. 202210288323.X, entitled in "METHOD OF DETECTING EARPHONE WEARING, EARPHONE, AND STORAGE MEDIUM" and filed on Mar. 23, 2022. The disclosures of the above-mentioned applications are incorporated herein by reference in their entireties.

TECHNICAL FIELD

The present application relates to the technical field of active noise cancellation (ANC), and in particular to a method of detecting earphone wearing, an earphone and computer-readable storage media.

BACKGROUND

After detecting skin contact, the capacitive sensor of the true wireless stereo (TWS) earphones determines whether the TWS earphones are worn through changes in capacitance value. However, there is a problem of insufficient accuracy in detecting the wearing condition of earphones through only a capacitive sensor. Moreover, due to differences in the ear shapes of different users, for example, for large ears, the user has better contact and larger capacitance value when wearing earphones. It is easy to distinguish between wearing and not wearing by comparing with the fixed threshold set at the factory. However, for small ears or some special ear shapes, the TWS earphones will fit poorly no matter how the user wears them. At this time, if the wearing condition of the TWS earphones is still compared with the fixed threshold, it will cause the TWS earphones to be slightly loose or not firmly worn, and it is difficult to detect the wearing, or even wearing is not detected.

The above content is only used to assist in understanding the technical solutions of the present application, and does not represent an admission that the above content is prior art.

SUMMARY

The main purpose of the present application is to provide a method of detecting earphone wearing, aiming to solve the technical problem in the related art that detecting the wearing condition of earphones is not accurate enough and difficult to adapt to users with different ear shapes, resulting in poor user experience.

In order to achieve the above purpose, the present application provides a method of detecting earphone wearing. The earphone includes at least two capacitive sensors. The method of detecting earphone wearing includes the following steps:

- determining whether the earphone is in a wearing state;
- in response to that the earphone is in a wearing state, determining whether capacitance values of all capacitive sensors are less than a corresponding initial threshold;
- in response to that the capacitance values of all capacitive sensors are less than the corresponding initial threshold, determining that the earphone is detached; and
- in response to that the capacitance value of at least one of the capacitive sensors is not less than the corresponding initial threshold, determining that the earphone is loose.

In an embodiment, the determining whether the earphone is in the wearing state includes:

- determining whether all the capacitance values are greater than the corresponding initial threshold;
- in response to that all the capacitance values are greater than the corresponding initial threshold, determining that the earphone is in the wearing state; and
- in response to that all the capacitance values are less than the corresponding initial threshold, determining that the earphone is detached.

In an embodiment, the earphone includes a first capacitive sensor and a second capacitive sensor, and the initial threshold includes a first threshold and a second threshold;

- the in response to that the capacitance values of all capacitive sensors are less than the corresponding initial threshold, determining that the earphone is detached includes:
- in response to that a first capacitance value is less than the first threshold and a second capacitance value is less than the second threshold, determining that the earphone is detached;
- the in response to that the capacitance value of at least one of the capacitive sensors is not less than the corresponding initial threshold, determining that the earphone is loose includes:
- in response to that the first capacitance value is not less than the first threshold and/or the second capacitance value is not less than the second threshold, determining that the earphone is loose.

In an embodiment, the method of detecting earphone wearing further including:

- in response to that the earphone is in the wearing state, obtaining the initial threshold of the earphone and recording the capacitance value of the capacitive sensor;
- obtaining the capacitance value of a preset number of wearing times before the earphone is detached, and obtaining an average capacitance value; and
- based on the average capacitance value, adjusting the initial threshold to a target threshold.

In an embodiment, before the obtaining the initial threshold of the earphone, the method further includes:

- obtaining a first test capacitance value of the capacitive sensor in response to that the earphone is worn and a second test capacitance value of the capacitive sensor in response to that the earphone is not worn in a factory test;
- obtaining a threshold setting coefficient and a threshold adjustment coefficient determined based on a product model of the earphone; and
- setting the initial threshold based on the first test capacitance value, the second test capacitance value and the threshold setting coefficient.

In an embodiment, before the adjusting the initial threshold to the target threshold, the method further includes:

- adjusting a step size of the initial threshold based on the threshold adjustment coefficient and a first difference between the first test capacitance value and the second test capacitance value.

In an embodiment, the adjusting the initial threshold to the target threshold includes:

- determining whether a second difference between the average capacitance value and the initial threshold is less than the step size, and whether a third difference between the initial threshold and the second test capacitance value is greater than the step size; and in response to that the second difference between the average capacitance value and the initial threshold is less than the step size, and the third difference between the initial threshold and the second test capacitance value is greater than the step size, then decreasing the initial threshold to the target threshold by the step size.

In an embodiment, after the adjusting the initial threshold to the target threshold, the method further includes:

configuring the target threshold as a new initial threshold, and performing the obtaining the initial threshold of the earphone.

In addition, in order to achieve the above object, the present application also provides an earphone, including:

a memory;

a processor; and a computer program stored on the memory and executable on the processor;

the computer program is configured to implement the steps of the method of detecting earphone wearing.

In addition, in order to achieve the above object, the present application also provides a computer-readable storage medium; a computer program is stored on the computer-readable storage medium, and when the computer program is executed by a processor, the steps of the method of detecting earphone wearing is implemented.

Embodiments of the present application provide a method of detecting earphone wearing, a threshold dynamic adjustment method, an earphone, and a computer-readable storage medium. The earphone includes at least two capacitive sensors. The method of detecting earphone wearing includes the following steps: determining whether the earphone is in a wearing state; in response to that the earphone is in a wearing state, determining whether capacitance values of all capacitive sensors are less than a corresponding initial threshold; in response to that the capacitance values of all capacitive sensors are less than the corresponding initial threshold, determining that the earphone is detached; and in response to that the capacitance value of at least one of the capacitive sensors is not less than the corresponding initial threshold, determining that the earphone is loose.

By using two capacitive sensors and placing them at different positions of the TWS earphones, the two parts of the ear skin that fit the TWS earphones are detected. Compared with the solution of using only one capacitive sensor to detect separately, the wearing state of the TWS earphones can be determined more accurately. The problem of insufficient accuracy in detecting the wearing state of earphones in the existing technology is solved, and the reliability and accuracy of wearing detection are improved.

The realization of the purpose, functional features and advantages of the present application will be further described with reference to the embodiments and the accompanying drawings.

DETAILED DESCRIPTION OF THE EMBODIMENTS

It should be understood that the specific embodiments described here are only used to explain the present application and are not used to limit the present application.

Figure 1:
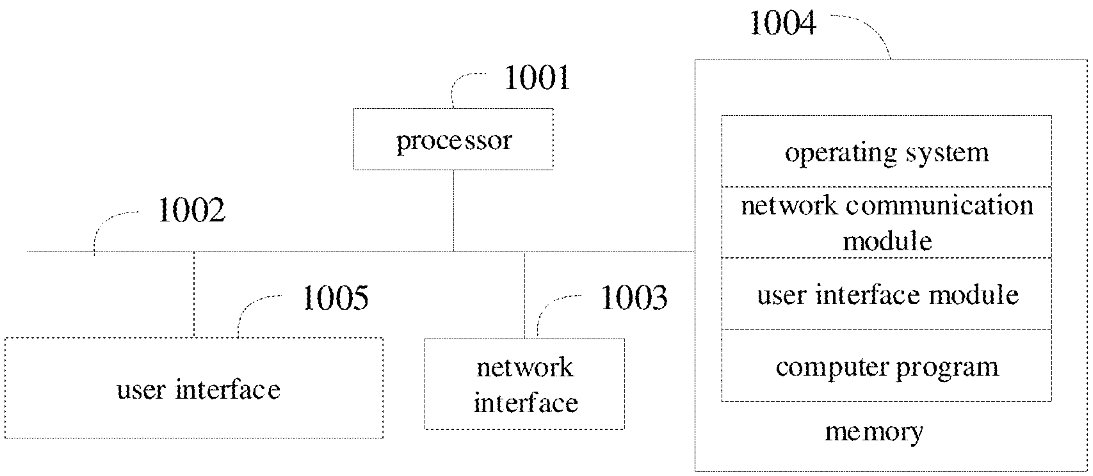
FIG. 1 is a schematic diagram of a terminal structure of a hardware operating environment according to an embodiment of the present application.

Referring to FIG. 1, FIG. 1 is a schematic diagram of the terminal structure of the hardware operating environment according to an embodiment of the present application.

As shown in FIG. 1, the terminal device may include: a processor 1001, such as a central processing unit (CPU), a communication bus 1002, a network interface 1003, a memory 1004, and a user interface 1005. Among them, the communication bus 1002 is used to realize connection communication between these components. The network interface 1003 may optionally include a standard wired interface or a wireless interface (such as a wireless fidelity (WI-FI) interface). The memory 1004 can be a high-speed random access memory (RAM) or a stable non-volatile memory (NVM), such as a disk memory. The memory 1004 may optionally be a storage device independent of the processor 1001.

Those skilled in the art can understand that the structure shown in FIG. 1 does not constitute a limitation on the terminal device, and may include more or fewer components than shown, or combine certain components, or arrange different components.

As shown in FIG. 1, a memory 1004 as a storage medium may include an operating system, a data storage module, a network communication module, a user interface module, and an adaptive adjustment program for ANC parameters.

In the terminal device shown in FIG. 1, the network interface 1003 is mainly used for data communication with other devices; the processor 1001 and the memory 1004 in the terminal device of the present application can be provided in the terminal device, and the terminal device calls the computer program stored in memory 1004 by the processor 1001 and performs the following operations:

It is determined whether the earphone is in a wearing state;

If the earphone is in a wearing state, it is determined whether the capacitance values of all capacitive sensors are less than the corresponding initial threshold;

If the capacitance values of all capacitive sensors are less than the corresponding initial threshold, it is determined that the earphone is detached;

If the capacitance value of at least one of the capacitive sensors is not less than the corresponding initial threshold, it is determined that the earphone is loose.

In an embodiment, the processor 1001 can call the computer program stored in the memory 1004 and also perform the following operations:

The step of determining whether the earphone is in a wearing state includes:

It is determined whether all the capacitance values are greater than the corresponding initial threshold;

If all the capacitance values are greater than the corresponding initial threshold, it is determined that the earphone is in a wearing state;

If all the capacitance values are less than the corresponding initial threshold, it is determined that the earphone is detached.

In an embodiment, the processor 1001 can call the computer program stored in the memory 1004 and also perform the following operations:

The earphone includes a first capacitive sensor and a second capacitive sensor, and the initial threshold includes a first threshold and a second threshold;

If the capacitance values of all capacitive sensors are less than the corresponding initial threshold, the step of determining that the earphone is detached includes:

If the first capacitance value is less than the first threshold and the second capacitance value is less than the second threshold, it is determined that the earphone is detached;

If the capacitance value of at least one of the capacitive sensors is not less than the corresponding initial threshold, the step of determining that the earphone is loose includes:

If the first capacitance value is not less than the first threshold and/or the second capacitance value is not less than the second threshold, it is determined that the earphone is loose.

In an embodiment, the processor 1001 can call the computer program stored in the memory 1004 and also perform the following operations:

The method of detecting earphone wearing also includes:

When the earphone is in the wearing state, the initial threshold of the earphone is obtained and the capacitance value of the capacitive sensor is recorded;

The capacitance value of the preset number of wearing times is obtained before the earphone is detached to obtain the average capacitance value;

Based on the average capacitance value, the initial threshold is adjusted to a target threshold.

In an embodiment, the processor 1001 can call the computer program stored in the memory 1004 and also perform the following operations:

Before the step of obtaining the initial threshold of the earphone, the method further includes:

Obtaining the first test capacitance value of the capacitive sensor when the earphone is worn in the factory test and the second test capacitance value of the capacitive sensor when the earphone is not worn;

Obtaining the threshold setting coefficient and threshold adjustment coefficient determined based on the product model of the earphone;

The initial threshold is set based on the first test capacitance value, the second test capacitance value and the threshold setting coefficient.

In an embodiment, the processor 1001 can call the computer program stored in the memory 1004 and also perform the following operations:

Before the step of adjusting the initial threshold to the target threshold, the method further includes:

A step size for adjusting the initial threshold is determined based on the threshold adjustment coefficient and a first difference between the first test capacitance value and the second test capacitance value.

In an embodiment, the processor 1001 can call the computer program stored in the memory 1004 and also perform the following operations:

The step of adjusting the initial threshold to the target threshold includes:

Determining whether the second difference between the average capacitance value and the initial threshold is less than the step size, and whether the third difference between the initial threshold and the second test capacitance value is greater than the step size;

If the second difference between the average capacitance value and the initial threshold is less than the step size, and the third difference between the initial threshold and the second test capacitance value is greater than the step size, then decreasing the initial threshold to the target threshold by the step size.

In an embodiment, the processor 1001 can call the computer program stored in the memory 1004 and also perform the following operations:

After the step of adjusting the initial threshold to the target threshold, the method further includes:

Using the target threshold as the new initial threshold, and performing the step of obtaining the initial threshold of the earphone.

Figure 2:
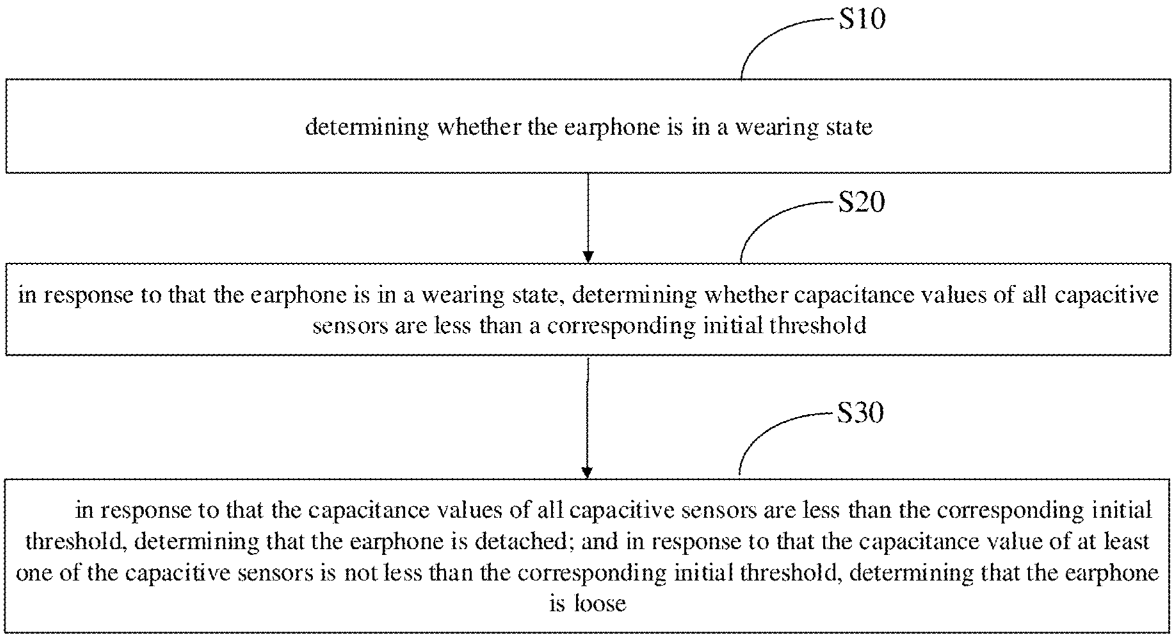
FIG. 2 is a schematic flowchart of a method of detecting earphone wearing according to an embodiment of the present application.

An embodiment of the present application provides a method of detecting earphone wearing. Referring to FIG. 2, which is a schematic flowchart of a method of detecting earphone wearing according to a first embodiment of the present application.

In this embodiment, the earphones include at least two capacitive sensors, and the method of detecting earphone wearing includes the following steps:

Step S10: Determining whether the earphone is in a wearing state.

Figure 3:
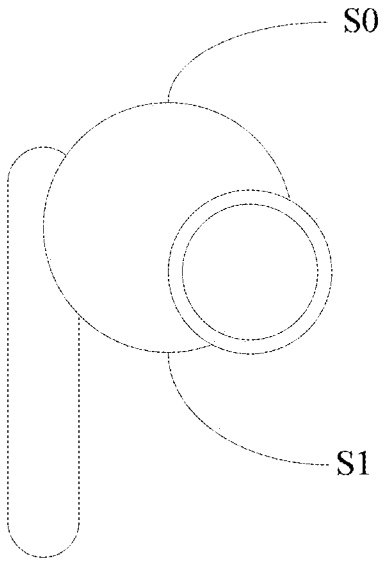
FIG. 3 is a schematic diagram of a location of a capacitive sensor of a TWS earphone of the present application.

Referring to FIG. 3, FIG. 3 is a schematic diagram of the location of the capacitive sensor of the TWS earphone of the present application. When designing TWS earphones, we choose to place the capacitive sensor at a position where the in-ear part of the TWS earphones is in full contact with the ear skin. When the user wears it, the ear comes into contact with the capacitive sensor, causing the capacitance value to change. In this embodiment, the sensor or device for detecting whether the earphones are worn is not limited. In an embodiment, when it is a capacitive sensor, its installation position should be in full contact with the ears. In this embodiment, the number of sensors that can be installed considering the volume of the earphones can be 3 capacitive sensors or 4 capacitive sensors. This embodiment does not limit the number of sensors placed, but their installation positions cannot be exactly the same. That is to say, the collected sensor data should not be exactly the same within the error tolerance.

Step S20: If the earphone is in a wearing state, determining whether the capacitance values of all capacitive sensors are less than the corresponding initial threshold.

In this embodiment, the states of the earphones are defined as a wearing state, a loose state without falling off, and a detached state without being worn. When the capacitance values of all capacitive sensors are greater than the corresponding initial thresholds, it is determined that the earphones are in the wearing state; when the capacitance values of all capacitive sensors are less than the corresponding initial thresholds, the earphones are determined to be in the detached state; when a capacitance value of at least one capacitive sensor is greater than the corresponding initial threshold, it is determined that the earphone is in a loose state.

If the user has put on the earphones and the earphones are in the wearing state, the relationship between the capacitance values of all capacitive sensors and the corresponding initial thresholds is determined to determine whether the earphones have fallen off or become loose after being in the wearing state.

Step S30: If the capacitance values of all capacitive sensors are less than the corresponding initial threshold, it is determined that the earphone is detached;

If the capacitance value of at least one of the capacitive sensors is not less than the corresponding initial threshold, it is determined that the earphone is loose.

If the capacitance values of all capacitive sensors are less than the corresponding initial threshold, it is determined that the earphones are in a detached state; if the capacitance value of at least one capacitive sensor is not less than the corresponding initial threshold, the earphones are determined to be in a loose state. It should be noted that the determination condition for determining that the earphones are in a loose state does not include the condition that the capacitance values of all capacitive sensors are less than the corresponding initial thresholds. This condition is designated as a condition for determining whether the earphones are in a detached state.

In this embodiment, the earphones include at least two capacitive sensors, and the method of detecting earphone wearing includes the following steps: determining whether the earphones are in a wearing state; if the earphones are in a wearing state, determining whether the capacitance values of all the capacitive sensors are less than the corresponding initial threshold;

if the capacitance values of all the capacitive sensors are less than the corresponding initial thresholds, determining that the earphones have fallen off; if the capacitance value of at least one of the capacitive sensors is not less than the corresponding initial threshold, determining that the earphones are loose.

If the user has put on the earphones and the earphones are in the wearing state, the relationship between the capacitance values of all capacitive sensors and the corresponding initial thresholds is determined to determine whether the earphones have fallen off or become loose after being in the wearing state. If the capacitance values of all capacitive sensors are less than the corresponding initial threshold, it is determined that the earphones are in a detached state; if the capacitance value of at least one capacitive sensor is not less than the corresponding initial threshold, the earphones are determined to be in a loose state.

By using capacitive sensors arranged at different positions of the TWS earphones to detect the capacitance value at the ear skin that fits the TWS earphones, the state of the TWS earphones can be accurately determined through at least two capacitance values, solving the problem that only using a capacitive sensor is not accurate enough in detecting the wearing state of the earphones in the existing technology, and the current state of the earphones cannot be accurately determined, such as: wearing state, loose state, and detached state, thus improving the reliability and accuracy of wearing detection.

And according to the user's recent wearing situation, the threshold is adaptively adjusted to solve the technical problem that the existing wearing detection method is difficult to adapt to users with different ear shapes, resulting in poor user experience, so as to achieve the effect of adapting to users with different ear shapes, and further improve user experience.

In an embodiment, the step of determining whether the earphones are in a wearing state includes:

Determining whether all the capacitance values are greater than the corresponding initial threshold;

If all the capacitance values are greater than the corresponding initial threshold, it is determined that the earphone is in a wearing state;

If all the capacitance values are less than the corresponding initial threshold, it is determined that the earphone is detached.

By determining the capacitance values of different capacitive sensors and the corresponding thresholds, it is determined whether the earphones are in a wearing state. If all capacitance values are greater than the corresponding initial thresholds, it is determined that the earphones are in a wearing state; if all capacitance values are less than the corresponding initial thresholds, it is determined that the earphones are in a detached state.

In an embodiment, the earphone includes a first capacitive sensor and a second capacitive sensor, and the initial threshold includes a first threshold and a second threshold;

If the capacitance values of all capacitive sensors are less than the corresponding initial threshold, the step of determining that the earphones are detached includes:

If the first capacitance value is less than the first threshold and the second capacitance value is less than the second threshold, it is determined that the earphone is detached;

If the capacitance value of at least one of the capacitive sensors is not less than the corresponding initial threshold, the step of determining that the earphone is loose includes:

If the first capacitance value is not less than the first threshold and/or the second capacitance value is not less than the second threshold, it is determined that the earphone is loose.

In this embodiment, according to the contact characteristics between the user and the earphones when wearing them, two-channel capacitive sensors are placed at positions S0 and S1 in FIG. 3 to determine whether the TWS earphones are in a wearing state.

In this embodiment, two capacitive sensors are placed in the earphones, and the corresponding initial thresholds are the first threshold and the second threshold. At this time, the step for determining that the earphones are detached is as follows: if the first capacitance value is less than the first threshold and the second capacitance value is less than the second threshold, it is determined that the earphones are in the detached state; the step for determining that the earphones are loose is as follows: if the first capacitance value is not less than the first threshold and/or the second capacitance value is not less than the second threshold, it is determined that the earphone is in a loose state. Similarly, the step for determining that the earphones are worn is as follows: if the first capacitance value is not less than the first threshold and the second capacitance value is not less than the second threshold, it is determined that the earphones are in a wearing state. It should also be noted that the determination conditions for determining that the earphones are in a loose state do not include the condition that the capacitance values of the two capacitive sensors are both less than the corresponding initial thresholds. This condition is designated as a condition for determining whether the earphones are in a detached state.

In an embodiment, the method of detecting earphone wearing also includes:

When the earphone is in the wearing state, obtaining the initial threshold of the earphone and recording the capacitance value of the capacitive sensor;

Obtaining the capacitance value of the preset number of wearing times before the earphones are detached, and obtaining the average capacitance value;

Based on the average capacitance value, the initial threshold is adjusted to a target threshold.

In this embodiment, two capacitive sensors are taken as an example for illustration. Since the ear shapes of different users are different, for example, for large ears, when the user wears the capacitive sensor, the contact situation of the capacitive sensor, that is, S0 and S1 in FIG. 3 is better, the capacitance value is larger, and it is easy to distinguish between wearing and not wearing. However, for small ears or some special ear shapes, no matter how the user wears them, there will always be a situation where one channel of S0 and S1 fits better and the other channel fits worse. If the capacitance value corresponding to a channel with poor fit is close to the threshold, it will cause the wearing to be undetectable when it is slightly loose or the wearing is not firm.

In this embodiment, the preset adjustment of one of the two capacitive sensors is taken as an example for illustration. Therefore, the initial threshold W0 of the initial S0 channel is set through production line testing and calibration at the factory. When the user puts on the earphones and the earphones are in the wearing state, the capacitance value C0 of the S0 channel is recorded. Then the capacitance value C0 of the preset number of wearing times is obtained before the TWS earphones come off, and the average capacitance value Cavg0 is obtained. In this embodiment, the capacitance value C0 during the last ten wears is collected to calculate the average capacitance value Cavg0, and the initial threshold W0 is adjusted to the target threshold based on the average capacitance value Cavg0.

In an embodiment, before the step of obtaining the initial threshold of the earphone, the method further includes:

Obtaining the first test capacitance value of the capacitive sensor when the earphone is worn in the factory test and the second test capacitance value of the capacitive sensor when the earphone is not worn;

Obtaining the threshold setting coefficient and threshold adjustment coefficient determined based on the product model of the earphone;

The initial threshold is set based on the first test capacitance value, the second test capacitance value and the threshold setting coefficient.

Through production line testing and calibration at the factory, the method for setting the initial threshold W0 of the initial S0 channel is: for each channel, obtaining the first test capacitance values Cw0, Cw1 when worn in the production line test and the second test capacitance values Cu0 and Cu1 when not worn; the initial threshold Wi=a*Cui+b*Cwi, where a+b=1, and the threshold setting coefficients a and b are set according to the product model and structural design. When i=0, the initial threshold W0 of the S0 channel is obtained, and when i=1, the initial threshold W1 of the S1 channel is obtained. In addition, the threshold adjustment coefficient is also determined based on the product model and structural design.

In an embodiment, before the step of adjusting the initial threshold to the target threshold, the method further includes:

A step size for adjusting the initial threshold is determined based on the threshold adjustment coefficient and a first difference between the first test capacitance value and the second test capacitance value.

Before adjusting the initial threshold to the target threshold, it is also necessary to determine the step size for adjusting the initial threshold W0. In this embodiment, the threshold adjustment coefficient used to adjust the initial threshold W0 of the S0 channel is 0.2, and the step size for adjusting the initial threshold W0 of the S0 channel is 0.2*(Cw0−Cu0), where (Cw0−Cu0) is the first difference. Similarly, the threshold adjustment coefficient used to adjust the initial threshold W1 of the S1 channel is also 0.2, and the step size used to adjust the initial threshold W1 of the S0 channel is 0.2*(Cw1−Cu1).

In an embodiment, the step of adjusting the initial threshold to a target threshold includes:

Determining whether the second difference between the average capacitance value and the initial threshold is less than the step size, and whether the third difference between the initial threshold and the second test capacitance value is greater than the step size;

If the second difference between the average capacitance value and the initial threshold is less than the step size, and the third difference between the initial threshold and the second test capacitance value is greater than the step size, then decreasing the initial threshold to the target threshold by the step size.

The method of adjusting the initial threshold W0 to the target threshold is to: determine whether the second difference between the average capacitance value Cavg0 and the initial threshold W0 is less than the step size, and whether the third difference between the initial threshold W0 and the second test capacitance value Cu0 is greater than the step size. If all the above conditions are met, the initial threshold W0 is reduced to the target threshold by the step size. In this way, the threshold is adaptively adjusted according to the user's recent wearing situation, solving the technical problem that the existing wearing detection method is difficult to adapt to users with different ear shapes, resulting in poor user experience, thereby achieving the effect of adapting to users with different ear shapes, and further improving user experience.

That is, determining whether the channel threshold needs to be adjusted based on the following two conditions:

$$1)\ (\text{Cavgi}-Wi)<0.2*(Cwi-Cui);$$

$$2)\ (Wi-Cui)>0.2*(Cwi-Cui);$$

Among them, (Cavgi−Wi) is the second difference between the average capacitance value in the wearing state and the threshold; (Cwi−Cui) is the third difference between the wearing and non-wearing state capacitance values in the production line test; 0.2*(Cwi−Cui) is the step size; (Wi−Cui) is the first difference between the threshold and the non-wearing state capacitance value tested on the production line; where i=0, 1, i=0 is the determination condition when determining the initial threshold W0 of the S0 channel, and i=1 is the determination condition when determining the initial threshold W1 of the S1 channel.

If both conditions are met at the same time, the current initial threshold is adjusted by the step size, and the threshold after the current initial threshold is reduced by the step size is used as the target threshold.

Here is an example: assuming that during the factory test, the first test capacitance value Cw0 obtained when the test is worn is 200, and the second test capacitance value Cu0 when not worn is 100. The initial threshold value is set according to the threshold setting coefficients a and b. W0 is 150, and the average capacitance value Cavg0 after wearing it ten times is 160, then the above two conditions are determined:

1) (Cavgi−Wi)<0.2*(Cwi−Cui), 160−150=10<0.2*(200−100), which means that the capacitance value when wearing is too close to the current threshold, and the threshold needs to be adjusted.

2) (Wi−Cui)>0.2*(Cwi−Cui), 150−100=50>0.2*(200−100), which means that the current threshold value is quite different from the capacitance value when not worn (the capacitance value tested at the factory when not worn is theoretically the same as the capacitance value when not worn and used by the user), and there is room to reduce the current threshold in the step size.

But supposing that the initial threshold W0 has been adjusted to 120, and the average capacitance value Cavg0 after actually wearing it ten times is 130. Although condition 1 is met at this time, because 120–100=20, condition 2 is not met, indicating that at this time the threshold value is very close to the capacitance value when not worn. It cannot continue to reduce the current threshold value in the step size, and there is no room to reduce the current threshold value in the step size. The above is the purpose of setting condition 2: to prevent the threshold from being adjusted to the capacitance value when not being worn, and to be less than the capacitance value when not being worn, resulting in the inability to distinguish between the unworn detached state, the not detached loose state and the wearing state of the TWS earphones.

In an embodiment, after the step of adjusting the initial threshold to the target threshold, the method further includes:

Using the target threshold as the new initial threshold, perform the step of obtaining the initial threshold of the earphone.

It should be noted that the threshold during threshold adjustment and the factory threshold are the same when the user performs the first threshold adjustment after wearing it, that is, the threshold at the first threshold adjustment is the threshold set by the factory. However, after the first threshold adjustment, the initial threshold in the method of detecting earphone wearing becomes the adjusted threshold, that is, the adjusted target threshold is used as the initial threshold for the next earphone wearing detection.

In addition, an embodiment of the present application also provides an earphone, which includes a memory, a processor, and a computer program stored on the memory and executable on the processor. The computer program is configured to implement the steps of the method of detecting earphone wearing described above.

In addition, embodiments of the present application also provide a computer-readable storage medium. A computer program is stored on the computer-readable storage medium. When the computer program is executed by a processor, the steps of the method of detecting earphone wearing as described above are implemented.

It should be noted that, as used herein, the terms "include", "comprise" or any other variation thereof are intended to cover a non-exclusive inclusion, such that a process, method, article or system that includes a list of elements not only includes those elements, but also includes other elements not expressly listed or that are inherent to the process, method, article or system. Without further limitation, an element defined by the statement "comprises a . . . " does not exclude the presence of other identical elements in the process, method, article, or system that includes that element.

The above serial numbers of the embodiments of the present application are only for description and do not represent the advantages and disadvantages of the embodiments.

Through the above description of the embodiments, those skilled in the art can clearly understand that the methods of the above embodiments can be implemented by means of software plus the necessary general hardware platform. Of course, it can also be implemented by hardware, but in many cases the former is the better implementation. Based on this understanding, the technical solution of the present application can be embodied in the form of a software product that is essentially or contributes to the existing technology. The computer software product is stored in a storage medium (such as ROM/RAM, magnetic disk, optical disk), including several instructions to cause a terminal device (which can be a mobile phone, computer, server, or network device, etc.) to execute the methods described in various embodiments of the present application.

The above are only some embodiments of the present application, and are not intended to limit the patent scope of the present application. Any equivalent structure or equivalent process transformation made using the contents of the description and drawings of the present application, or directly or indirectly used in other related technical fields, are all equally included in the patent scope of the present application.

What is claimed is:

1. A method of detecting earphone wearing, wherein the earphone comprises at least two capacitive sensors, and the method of detecting earphone wearing comprises:

determining whether the earphone is in a wearing state;

in response to that the earphone is in the wearing state, determining whether capacitance values of all capacitive sensors are less than a corresponding initial threshold;

in response to that the capacitance values of all capacitive sensors are less than the corresponding initial threshold, determining that the earphone is detached;

in response to that the capacitance value of at least one of the capacitive sensors is not less than the corresponding initial threshold, determining that the earphone is loose;

in response to that the earphone is in the wearing state, obtaining the initial threshold of the earphone and recording the capacitance value of the capacitive sensor;

obtaining the capacitance value of a preset number of wearing times before the earphone is detached, and obtaining an average capacitance value; and based on the average capacitance value, adjusting the initial threshold to a target threshold, wherein before the obtaining the initial threshold of the earphone, the method further comprises:

obtaining a first test capacitance value of the capacitive sensor in response to that the earphone is worn and a second test capacitance value of the capacitive sensor in response to that the earphone is not worn in a factory test;

obtaining a threshold setting coefficient and a threshold adjustment coefficient determined based on a product model of the earphone; and setting the initial threshold based on the first test capacitance value, the second test capacitance value and the threshold setting coefficient.

2. The method of detecting earphone wearing according to claim 1, wherein the determining whether the earphone is in the wearing state comprises:

determining whether all the capacitance values are greater than the corresponding initial threshold;

in response to that all the capacitance values are greater than the corresponding initial threshold, determining that the earphone is in the wearing state; and in response to that all the capacitance values are less than the corresponding initial threshold, determining that the earphone is detached.

3. The method of detecting earphone wearing according to claim 1, wherein the earphone comprises a first capacitive sensor and a second capacitive sensor, and the initial threshold includes a first threshold and a second threshold;

the in response to that the capacitance values of all capacitive sensors are less than the corresponding initial threshold, determining that the earphone is detached comprises:

in response to that a first capacitance value is less than the first threshold and a second capacitance value is less than the second threshold, determining that the earphone is detached;

the in response to that the capacitance value of at least one of the capacitive sensors is not less than the corresponding initial threshold, determining that the earphone is loose comprises:

in response to that the first capacitance value is not less than the first threshold and/or the second capacitance value is not less than the second threshold, determining that the earphone is loose.

4. The method of detecting earphone wearing according to claim 1, wherein before the adjusting the initial threshold to the target threshold, the method further comprises:

adjusting a step size of the initial threshold based on the threshold adjustment coefficient and a first difference between the first test capacitance value and the second test capacitance value.

5. The method of detecting earphone wearing according to claim 4, wherein the adjusting the initial threshold to the target threshold comprises:

determining whether a second difference between the average capacitance value and the initial threshold is less than the step size, and whether a third difference between the initial threshold and the second test capacitance value is greater than the step size; and in response to that the second difference between the average capacitance value and the initial threshold is less than the step size, and the third difference between the initial threshold and the second test capacitance value is greater than the step size, then decreasing the initial threshold to the target threshold by the step size.

6. The method of detecting earphone wearing according to claim 1, wherein after the adjusting the initial threshold to the target threshold, the method further comprises:

configuring the target threshold as a new initial threshold, and performing the obtaining the initial threshold of the earphone.

7. An earphone, comprising:

a memory;

a processor; and a computer program stored on the memory and executable on the processor;

wherein the computer program is configured to implement the steps of the method of detecting earphone wearing according to claim 1.

8. A non-transitory computer-readable storage medium, wherein a computer program is stored on the computer-readable storage medium, and when the computer program is executed by a processor, the steps of the method of detecting earphone wearing according to claim 1 is implemented.

* * * * *